United States Patent [19]
Didier

[11] Patent Number: 6,023,192
[45] Date of Patent: Feb. 8, 2000

[54] DUAL GAIN AMPLIFIER CIRCUIT

[75] Inventor: Belot Didier, Rives, France

[73] Assignee: STMicroelectronics S.A., Gentilly, France

[21] Appl. No.: 09/169,518

[22] Filed: Oct. 9, 1998

[30] Foreign Application Priority Data

Oct. 22, 1997 [FR] France .................................. 97 13232

[51] Int. Cl.[7] ................................. H03F 3/45; H03F 3/04
[52] U.S. Cl. ........................................... 330/254; 330/311
[58] Field of Search ..................................... 330/252, 254, 330/310, 311

[56] References Cited

U.S. PATENT DOCUMENTS

| | | | |
|---|---|---|---|
| 3,333,200 | 7/1967 | Wolfram ................................. | 325/443 |
| 3,611,001 | 10/1971 | Bacon ...................................... | 315/18 |
| 3,743,863 | 7/1973 | Hilbert et al. ........................... | 330/252 |
| 4,232,272 | 11/1980 | Fabri ...................................... | 330/310 |
| 4,339,728 | 7/1982 | Monticelli ............................... | 330/254 |
| 4,520,324 | 5/1985 | Jett, Jr. et al. ......................... | 330/285 |
| 4,663,599 | 5/1987 | Patch ..................................... | 330/310 |
| 5,313,207 | 5/1994 | Kouno et al. ........................... | 341/156 |

FOREIGN PATENT DOCUMENTS

| | | | |
|---|---|---|---|
| 0 475 118 A2 | 8/1991 | European Pat. Off. .......... | H03F 3/72 |
| 28 29 164 A1 | 1/1980 | Germany .......................... | H03J 5/00 |

OTHER PUBLICATIONS

J. Craninckx et al., "A 1.8–GHz Low–Phase–Noise CMOS VCO Using Optimized Hollow Spiral Inductors," IEEE Journal of Solid–State Circuits, vol. 32, No. 5, May 1997, pp. 736–744.

Y. Koutsoyannopoulos et al., "A Generic CAD Model for Arbitrarily Shaped and Multi–Layer Intergrated Inductors on Silicon Subtrates," National Technical University of Athens, Microelectronic Circuit Design Group, and SGS–Thomson Microelectronics, RF Division, pp. 320–323.

*Primary Examiner*—Robert Pascal
*Assistant Examiner*—Patricia T. Nguyen
*Attorney, Agent, or Firm*—Theodore E. Galanthay; Allen, Dyer, Doppelt, Milbrath & Gilchrist, P.A.

[57] ABSTRACT

A dual gain amplifier provides separate gains so that the amplifier's input characteristics are unaffected by the gain selected. The dual gain amplifier comprises a first input amplifier and a third amplifier connected in cascade, and a second input amplifier and a fourth amplifier connected in cascade. A first LC circuit is connected in parallel to a second LC circuit which are both connected to the third amplifier. Likewise, a third LC circuit is connected in parallel to a fourth LC circuit which are connected to the fourth amplifier. The first and third LC circuits have a first quality factor and the second and fourth LC circuits have a second quality factor. The dual gain amplifier switches from a first state in which only the first and third LC circuits conduct to a second state in which all four LC circuits conduct.

27 Claims, 5 Drawing Sheets

DUAL GAIN AMPLIFIER CIRCUIT

FIELD OF THE INVENTION

The present invention relates to the field of amplifiers, and more particularly, to a switchable-gain amplifier for radio frequency (RF) applications.

BACKGROUND OF THE INVENTION

Low-noise, switchable-gain amplifier circuits are known in the art. A first embodiment is shown in FIG. 1. The amplifier in this figure has two input amplifiers 2, 4. The emitter of each amplifier is connected to an inductor 6, 8 that compensates the input capacity (base-emitter capacity) of the corresponding bipolar transistor.

Each of these input amplifiers is connected to an amplifier 10, 12 to create a cascaded circuit. The collector of each amplifier 10, 12 is connected to a respective load, or trap circuit 14, 16, which is an LC circuit comprising a capacitor 20, 22 and an inductor 18, 24 connected in parallel.

Two output transistors 26, 28 are connected as emitter-followers and each one is connected to a respective current source 30, 32. Their bases are connected to points A and B respectively. These transistors 26, 28 thus supply a signal that is an image of the signal in the corresponding LC circuit.

In order to switch between high and low gain states, the circuit comprises means 34, 36 for short-circuiting the gain stage. The input of each amplifier 2, 4 is connected to the emitter of each respective output amplifier 26, 28. This particular circuit configuration modifies the input impedance. During operation, there is a risk of creating a phase rotation between input signals IN of amplifier 2 and NIN of amplifier 4. This type of phase rotation may cause oscillation of the apparatus while destroying its amplifying effect. The apparatus would operate as an oscillator instead of an amplifier, with or without gain.

The other approach known in the art will now be described with reference to FIG. 2. References that are the same as those in FIG. 1 relate to the same components. Compensating inductors 6, 8 are connected to a current source 34 for determining the current of the input stage. Variations in the input stage current cause variations in the capacitance of input transistors 2, 4. The capacitance of the transistors is related to biasing of the transistor in question. This variation in the capacitance of each input transistor 2, 4 results in a variation in the input impedance of the system. However, any variation in input impedance reduces adaptation of the circuit. From this perspective, the second approach is no better than the first approach.

Therefore, there is a need for an amplifying apparatus that provides a dual gain or even a multiple gain, wherein such a circuit makes it possible for the amplifier's input characteristics to be unaffected irrespective of the gain selected.

SUMMARY OF THE INVENTION

The invention relates to a dual gain amplifier apparatus. One embodiment comprises a first and a second input amplifier, and a third and a fourth amplifier respectively coupled to the first and second input amplifiers for forming a first and second cascaded circuit. A first and second LC circuit are connected in parallel with one another and both are connected to the third amplifier. A third and fourth LC circuit are connected in parallel with one another and both are connected to the fourth amplifier. The first and third LC circuits each have a first quality factor and the second and fourth LC circuits each have a second quality factor. The dual gain amplifier apparatus comprises means for switching the amplifier apparatus from a first state in which only the first and third LC circuits conduct to a second state in which all four LC circuits are conducting.

Each input amplifier therefore has two circuits, each with a different quality factor for modifying the amplifier gain by using the switching means. The third and fourth input amplifiers that form cascaded circuits with the first and second input amplifiers avoid modifying the input impedance of the apparatus. The feature retains desirable impedance adaptation at an excellent reflection coefficient.

The second quality factors (of the second and fourth LC circuits) are, for example, lower than the first quality factors (of the first and third LC circuits). The inductor of each of the second and fourth LC circuits may be integrated on a silicon substrate. An inductor mounted on silicon cannot be separated from its own filtering components due to the silicon substrate itself and the metallic materials used to construct the inductor. This reduces the quality factor of the inductor and has the effect of limiting the gain that can be obtained using an LC parallel circuit at a given frequency. Accordingly, this provides an inductor with a poor quality factor. When combined with a capacitor C, this inductor comprises an LC circuit that also has a poor quality factor. However, this type of inductor may be used to form, for example, the second and fourth LC circuits having a low quality factor.

The third and fourth amplifiers may be constructed using bipolar or MOS technology. The means used to switch the apparatus between a first and second state preferably comprises a first and second MOS transistor.

BRIEF DESCRIPTION OF THE DRAWINGS

The characteristics and advantages of the present invention will be better understood from the following detailed description. The description provides examples of non-limitative embodiments and refers to the attached figures, wherein.

DETAILED DESCRIPTION OF THE PREFERRED EMBODIMENTS

Figure 1:
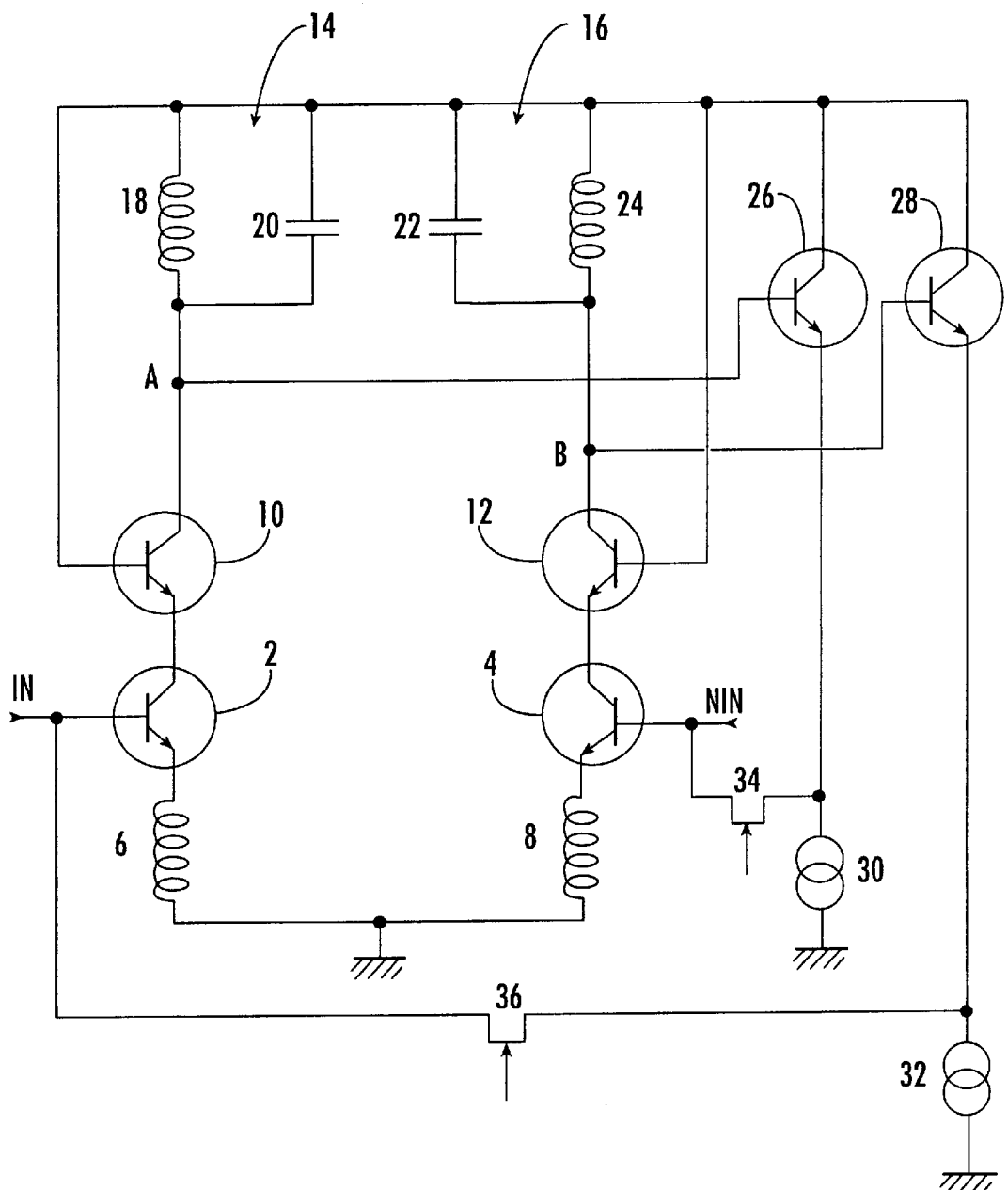
FIG. 1 shows a first dual-gain apparatus of the prior art.
Figure 2:
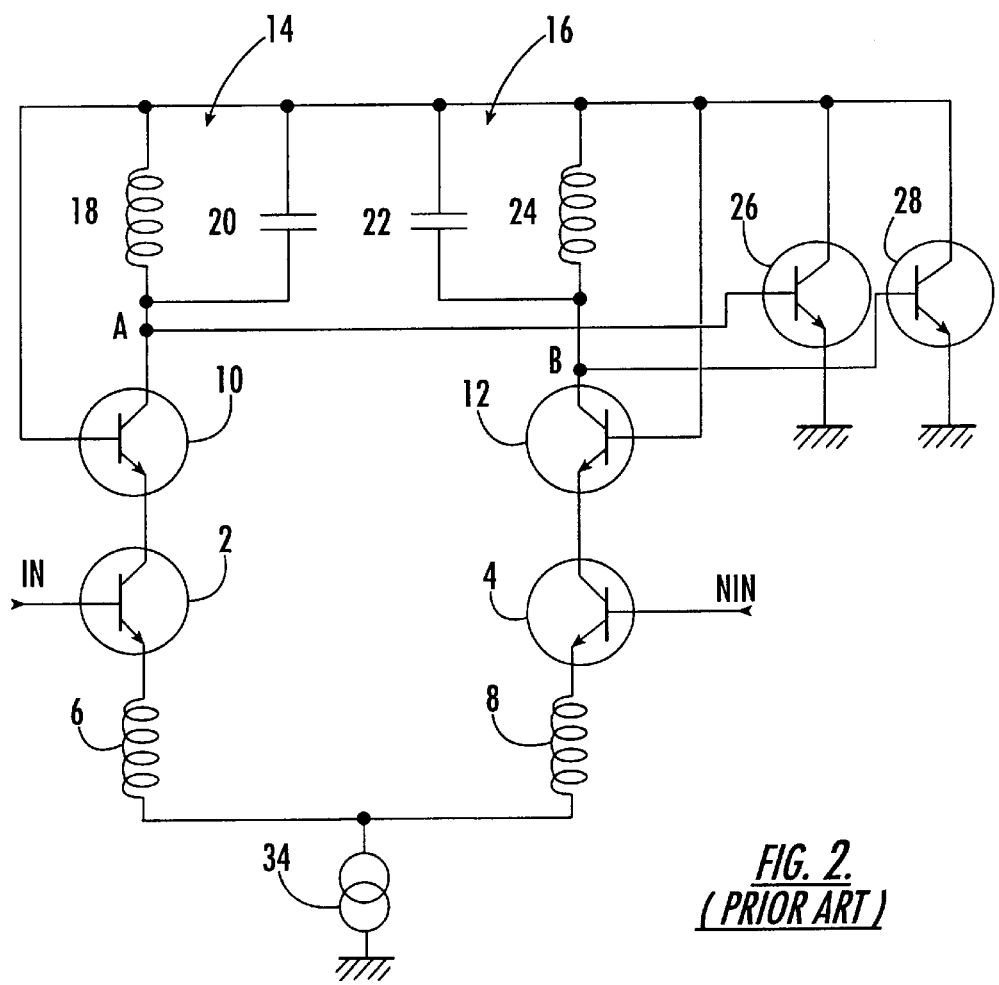
FIG. 2 shows a second dual-gain apparatus of the prior art.
Figure 3:
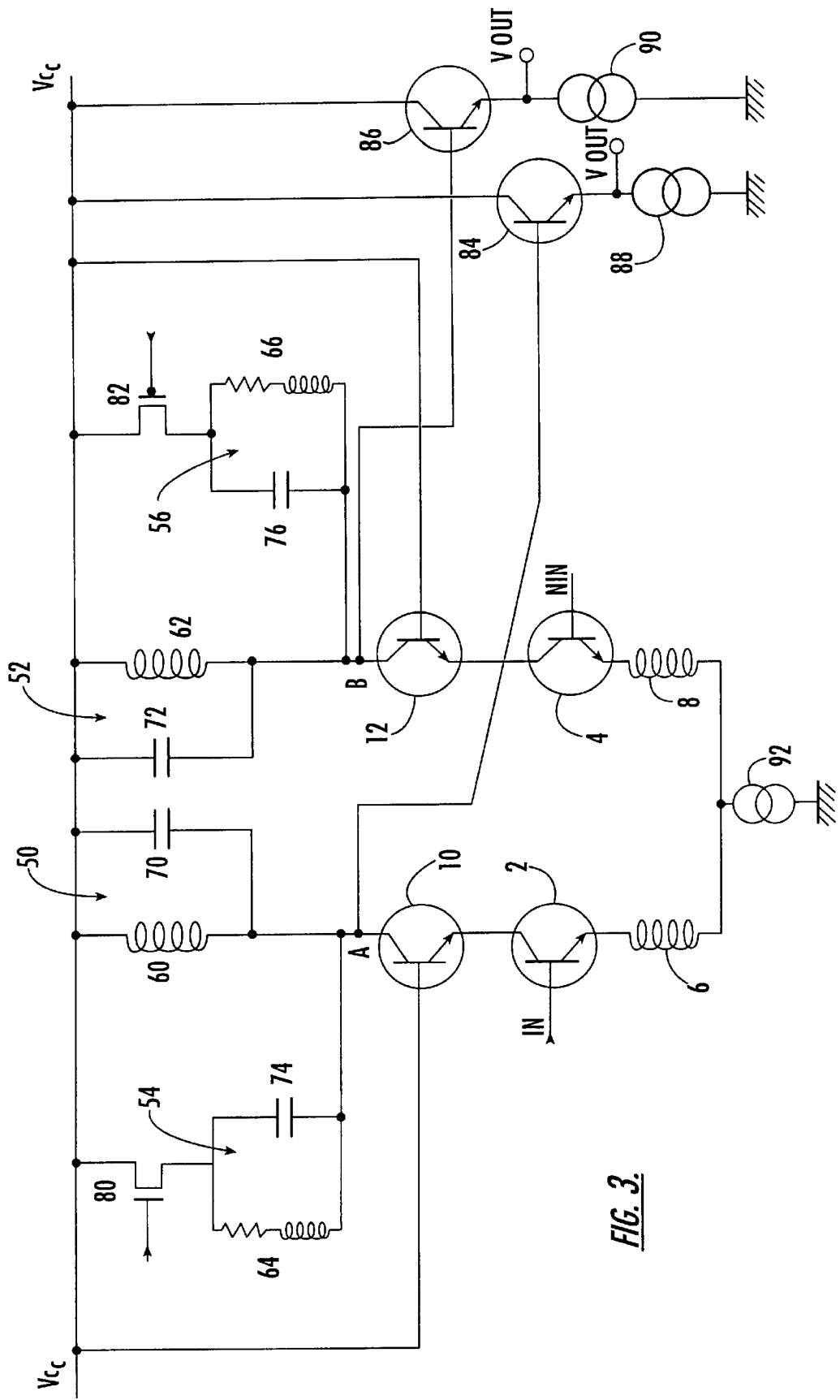
FIG. 3 shows an embodiment of a dual gain amplifier according to the invention.

A dual gain amplifier apparatus according to the invention is shown in FIG. 3. As shown in FIGS. 1 and 2, references 2 and 4 designate input amplifiers. These input amplifiers 2, 4 are connected to a respective compensating inductor 6, 8 (inductance value $L_6$, $L_8$). These reference designations have the same function as the same reference designations described above with reference to FIGS. 1 and 2. Together with amplifiers 2 and 4, amplifiers 10 and 12 form cascaded circuits. All of these amplifiers may be formed using bipolar or MOS technology.

The first cascaded circuit comprises amplifiers 2 and 10 which are connected to two LC circuits 50 and 54. Each LC circuit 50, 54 respectively includes an inductor 60 (value $L_2$), 64 (value $L_1$) connected in parallel with a capacitor 70 (value $C_2$), 74 (value $C_1$). The two LC circuits 50, 54 are connected in parallel. Circuit 54 is connected to commutation means 80. Depending on whether the commutation means 80 is open or closed, the load circuit 50 of amplifier 10 comprises either circuit 50 or the two LC circuits 50 and 54 connected in parallel.

Similarly, the second cascaded circuit comprises amplifiers 4 and 12 which are connected to two LC circuits 52 and 56. Each LC circuit respectively includes an inductor 62 (value $L_2$), 66 (value $L_1$) connected in parallel with a capacitor 72 (value $C_2$), 76 (value $C_1$). The two LC circuits 52 and 56 are connected in parallel. Circuit 56 is connected to commutation means 82. Depending on whether the commutation means 82 is open or closed, the load circuit of amplifier 12 comprises either circuit 52 or the two LC circuits 52 and 56 connected in parallel.

The circuit also comprises two output transistors 84, 86 having bases respectively connected to points A and B. These output transistors 84, 86 supply a signal that is an image of that in the corresponding load circuit. Each of these two output transistors 84, 86 is connected to a respective current source 88, 90 as an emitter-follower. The output transistors 84, 86 and the load circuits are connected to a power supply rail 51 carrying a DC voltage.

A current source 92 is used to ensure a constant current in the emitters of input transistors 2, 4. To maintain this type of constant current, a constant biasing point is set for input transistors 2, 4. Commutation means 80, 82 are preferably constructed using MOS technology and fitted as switches.

In the circuit described above, each transistor 10, 12 is connected to two respective LC circuits, one of which may be connected in parallel with the other. The characteristics of these circuits are selected so that they have different quality factors from one another. For example, if LC circuit 54 has a lower quality factor while circuit 50 has a higher quality factor, then the parallel connection of the two circuits results in a variation in amplifier gain.

$L_1$, $L_2$, $C_1$ and $C_2$ are preferably chosen so that:

$$L_1 C_1 = L_2 C_2,$$

which ensures that the oscillation frequency of the load circuits is maintained irrespective of the status of the apparatus, i.e., irrespective of the switching status of commutators 80, 82. For this reason, the following relations may be used: $L_1 \ll L_2$ and $C_1 \gg C_2$.

An advantageous way of forming LC circuits with different quality factors includes forming inductors $L_1$, $L_2$ with different quality factors. For example, the aim is therefore to form a high-rating inductor $L_2$ with a high quality value and a low-rating inductor $L_1$ with a low quality value.

This result may be achieved by forming inductors integrated on silicon. An inductor mounted on silicon cannot be separated from its own filtering components which reduces the quality factor of the inductor. This has the effect of limiting the possible gain that can be obtained in an LC parallel circuit at a given frequency.

Figure 4:
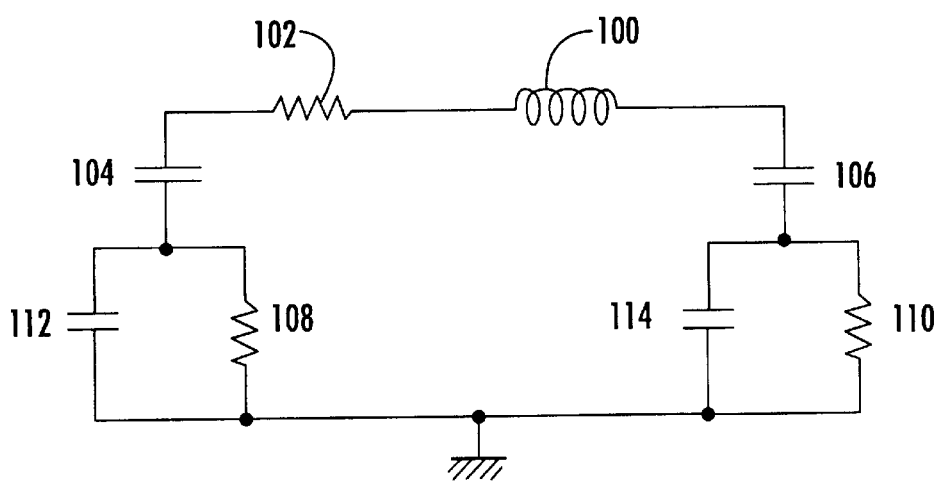
FIG. 4 shows a model of a silicon-mounted inductor according to the invention.

FIG. 4 shows an inductor 100 formed on silicon complete with its filtering components: resistors 102, 108 and 110, and capacitors 104, 106, 112, 114. Modification of the characteristics of inductor 100 causes modification of the values of these resistors and capacitors. For example, if the inductor has a larger contact surface with the silicon substrate, the associated filtering components (resistors and capacitors) will be correspondingly larger. The quality factor of the inductor for a given pulse frequency (f) is given by the relation:

$$Q = L\omega / R,$$

where R is the value of resistor 102, and where Omega $\omega$ is $2\pi f$.

It is therefore possible to achieve an inductor that has a poor quality factor and subsequently connect it to a capacitor 74, 76 to form one of the circuits 54, 56. The quality factor of these circuits will be medium or poor (e.g. Q<2.5), and in all cases different from that of circuits 50, 52 (e.g. Q>4) which may be formed using different techniques. Circuits 50, 52 are, for example, formed using ASGA technology or mounted on a printed circuit. This provides an insulating substrate where there is no adequate filtering component. Under these circumstances it is possible to obtain Q>10.

A procedure for forming an inductor on a silicon substrate is described in an article by J. Craninckx et al., entitled "A 1.8 GHz Low-Phase-Noise CMOS VCO Using Optimized Hollow Spiral Inductors." This article appeared in the IEEE Journal of Solid-State Circuits, Vol. 32, No. 5, 1997. This article describes the noise effects of the substrate on the inductor and describes how an inductor may be formed.

An article by Y. Koutsoyannopoulos et al., entitled "A Generic CAD Model for Arbitrarily-Shaped and Multi-layer Integrated Inductors on Silicon Substrates," appeared in the Proceedings of the ESSCIRC 97 Conference, p. 320–323. This article describes noise in an inductor and attempts to model it.

In one embodiment, an amplifier according to the invention was constructed with the following characteristics:

$C_1$=2.5 pF, $C_2$=0.8 pF, $L_1$=0.817 nH, $L_2$=5.02 nH, $L_6$=$L_8$=0.258 nH, transistors 2, 4, 10, 12, 84 and 86 are NPN transistors, e.g., reference N16C.

Figure 5:
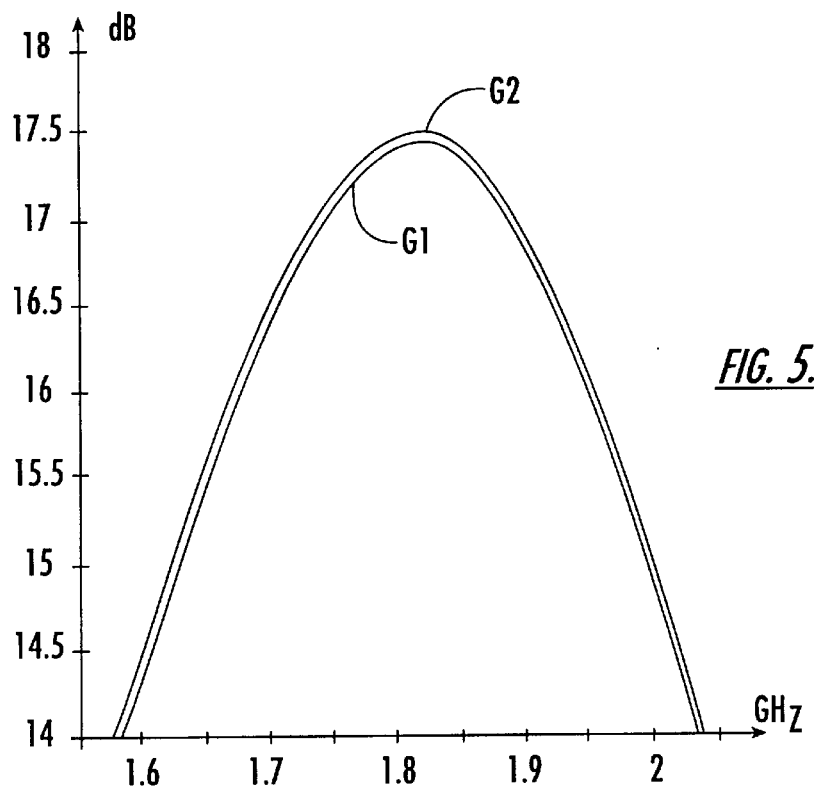
FIG. 5 shows the gain curves of an apparatus according to the invention with the commutators closed.

FIG. 5 shows the curve of gain G of the circuit ($G_1 = V_{NOUT}/V_{NIN}$, $G_2 = V_{OUT}/V_{IN}$) as a function of the frequency when the frequency varies between 1.55 and 2.05 GHz, and when the commutators 80, 82 are conducting. The gain G obtained is approximately 17.55 dB±0.024 dB for $\omega$=1.8 GHz. The pass band at −3 dB is 410 MHz. The quality factor of the circuit in this state is approximately: $Q_{ON} \approx 1800/410 \approx 4.4$.

Figure 6:
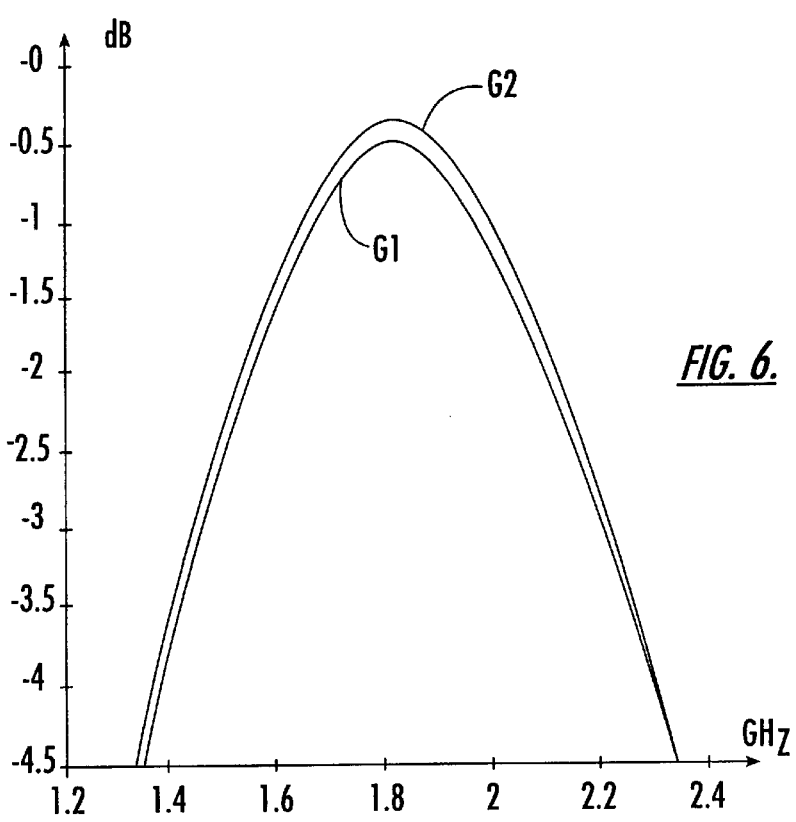
FIG. 6 shows the gain curves of an apparatus according to the invention with the commutators open.

FIG. 6 also shows the development of gain ($G_1 = V_{NOUT}/V_{NIN}$; $G_2 = V_{OUT}/V_{IN}$) as a function of the frequency when the frequency varies between 1.35 and 2.4 GHz, and when the two commutators 80, 82 are open. The gain is approximately −0.4 dB±0.075 dB and the pass band at −3 dB is approximately 838 MHz. This provides a quality factor of $Q \approx 1800/838 \approx 2.15$. Changing the commutators 80, 82 from conducting to an open state therefore changes the quality factor of the circuit from a value of 4.4 to one of 2.15.

Figure 7:
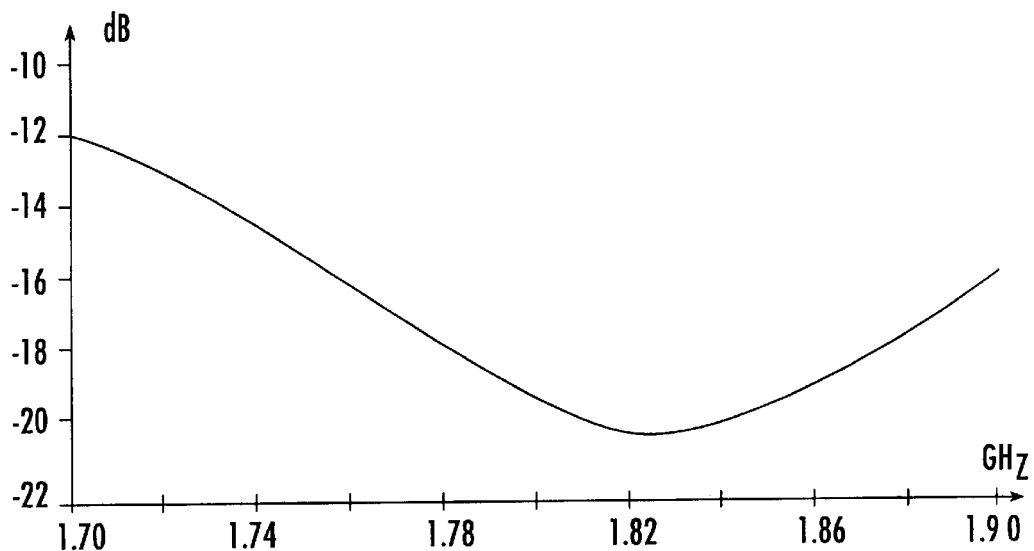
FIG. 7 shows the reflection coefficient for an input of an apparatus according to the invention.

FIG. 7 shows the reflection coefficient in decibels at the apparatus input when the frequency varies from 1.7 to 1.9 GHz. Throughout this frequency range, the reflection coefficient is very low and only varies slightly. Whether commutators 80, 82 are open or closed, the curve is identical in both cases.

Figure 8:
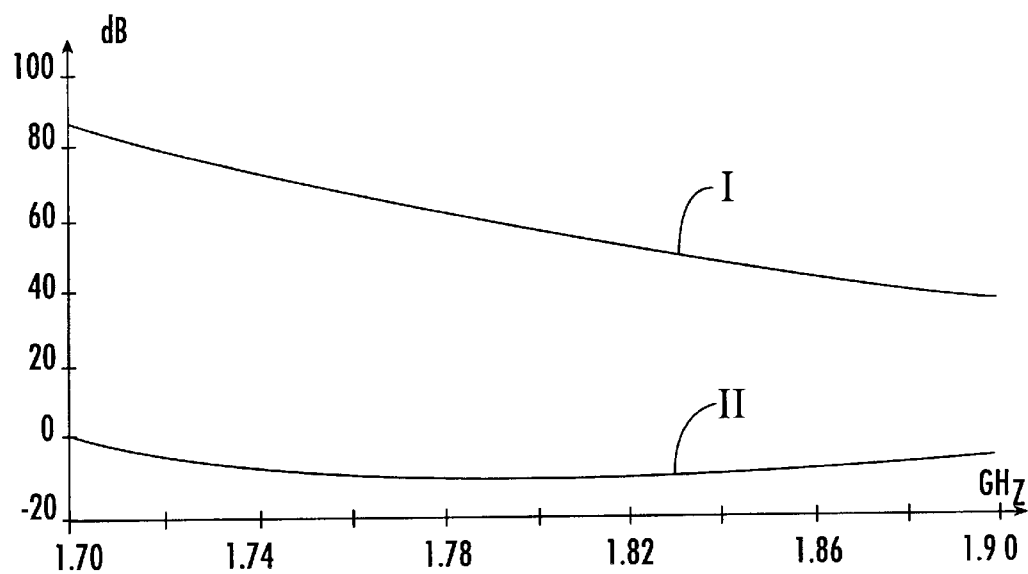
FIG. 8 shows the real and imaginary components of the input impedance of an apparatus according to the invention.

FIG. 8 shows the input impedance of the apparatus or, more precisely, the real (curve I) and imaginary (curve II)

components of the input impedance. The imaginary component of the input impedance remains at approximately 0 throughout the frequency range of 1.7–1.9 GHz. Only the real component of the impedance has a significant value.

These results demonstrate that efficient commutation is obtained for making it possible to change from a gain of 17.5 dB to a gain of −0.4 dB without variation of the input impedance and without modification to the reflection coefficient. As has already been described above, several LC circuits may be connected in parallel with each LC circuit 50, 52 to obtain commutation between several states so that each state has a different gain value. For example, two LC circuits may be connected in parallel with each respective LC circuit 50, 52. By including a commutator in each of these parallel circuits, it is possible to switch, for example, from a gain value of 17.5 dB to a value of 10 dB, or to a value of −0.5 dB.

That which is claimed is:

1. A dual gain amplifier comprising:
   a first input amplifier;
   a second input amplifier;
   a third amplifier coupled to the first input amplifier for forming a first cascaded circuit;
   a fourth amplifier coupled to the second input amplifier for forming a second cascaded circuit;
   a first LC circuit and second LC circuit connected in parallel and to said third amplifier;
   a third LC circuit and fourth LC circuit connected in parallel and to said fourth amplifier;
   the first and third LC circuits having a first quality factor, and the second and fourth LC circuits having a second quality factor; and
   means for switching the dual gain amplifier from a first state in which only the first and third LC circuits are conducting to a second state in which all four LC circuits are conducting.

2. A dual gain amplifier according to claim 1, wherein each of the second and fourth LC circuits comprises:
   an inductor; and
   a silicon substrate portion mounting said inductor.

3. A dual gain amplifier according to claim 1, wherein each of the third and fourth amplifiers comprises at least one bipolar transistor.

4. A dual gain amplifier according to claim 1, wherein each of the third and fourth amplifiers comprises at least one MOS transistor.

5. A dual gain amplifier according to claim 1, wherein the first quality factor is greater than about 4.5.

6. A dual gain amplifier according to claim 1, wherein the second quality factor is less than about 2.5.

7. A dual gain amplifier according to claim 1, wherein the means for switching the dual gain amplifier between a first and second state comprises a first and a second MOS transistor.

8. A dual gain amplifier comprising:
   a first input amplifier;
   a second input amplifier;
   a third amplifier coupled to the first input amplifier for forming a first cascaded circuit;
   a fourth amplifier coupled to the second input amplifier for forming a second cascaded circuit;
   a first LC circuit and second LC circuit connected in parallel and to said third amplifier;
   a third LC circuit and fourth LC circuit connected in parallel and to said fourth amplifier;
   the first and third LC circuits having a first quality factor and the second and fourth LC circuits having a second quality factor less than the first quality factor; and
   means for switching the dual gain amplifier from a first state in which only the first and third LC circuits are conducting to a second state in which all four LC circuits are conducting.

9. A dual gain amplifier according to claim 8, wherein each of the second and fourth LC circuits comprises:
   an inductor; and
   a silicon substrate portion mounting said inductor.

10. A dual gain amplifier according to claim 8, wherein each of the third and fourth amplifiers comprises at least one bipolar transistor.

11. A dual gain amplifier according to claim 8, wherein each of the third and fourth amplifiers comprises at least one MOS transistor.

12. A dual gain amplifier according to claim 8, wherein the first quality factor is greater than about 4.5.

13. A dual gain amplifier according to claim 8, wherein the second quality factor is less than about 2.5.

14. A dual gain amplifier according to claim 8, wherein the means for switching said dual gain amplifier between a first and second state comprises a first and a second MOS transistor.

15. A dual gain amplifier comprising:
   a first input amplifier;
   a second input amplifier;
   a third amplifier coupled to the first input amplifier for forming a first cascaded circuit;
   a fourth amplifier coupled to the second input amplifier for forming a second cascaded circuit;
   a first LC circuit and second LC circuit connected in parallel and to said third amplifier;
   a third LC circuit and fourth LC circuit connected in parallel and to said fourth amplifier;
   the second and fourth LC circuits each comprises an inductor, and a silicon substrate portion mounting said inductor;
   the first and third LC circuits having a first quality factor and the second and fourth LC circuits having a second quality factor less than the first quality factor; and
   means for switching the dual gain amplifier from a first state in which only the first and third LC circuits are conducting to a second state in which all four LC circuits are conducting.

16. A dual gain amplifier according to claim 15, wherein each of the third and fourth amplifiers comprises at least one bipolar transistor.

17. A dual gain amplifier according to claim 15, wherein each of the third and fourth amplifiers comprises at least one MOS transistor.

18. A dual gain amplifier according to claim 15, wherein the first quality factor is greater than about 4.5.

19. A dual gain amplifier according to claim 15, wherein the second quality factor is less than about 2.5.

20. A dual gain amplifier according to claim 15, wherein the means for switching said dual gain amplifier between a first and second state comprises a first and a second MOS transistor.

21. A method for providing a dual gain amplifier, comprising the steps of:
   forming a first input amplifier;
   forming a third amplifier coupled to the first input amplifier;
   forming a second input amplifier;
   forming a fourth amplifier coupled to the second input amplifier;
   connecting a first and second LC circuit in parallel and to the third amplifier;
   connecting a third and fourth LC circuit in parallel and to the fourth amplifier;
   selecting a first quality factor for the first and third LC circuits and selecting a second quality factor for the second and fourth LC circuits so that the first quality factor is greater than the second quality factor; and
   switching said dual gain amplifier from a first state in which only the first and third LC circuits are conducting to a second state in which all four LC circuits are conducting.

22. A method according to claim 21, further comprising the steps of mounting an inductor of each of the second and fourth LC circuits on a silicon substrate.

23. A method according to claim 21, further comprising the step of forming at least one bipolar transistor for each of the third and fourth amplifiers.

24. A method according to claim 21, further comprising the step of forming at least one MOS transistor for each of the third and fourth amplifiers.

25. A method according to claim 21, wherein the first quality factor is selected so that it is greater than about 4.5.

26. A method according to claim 21, wherein the second quality factor is selected so that it is less than about 2.5.

27. A method according to claim 21, wherein the step of switching comprises switching between a first MOS transistor and a second MOS transistor.

* * * * *

UNITED STATES PATENT AND TRADEMARK OFFICE
CERTIFICATE OF CORRECTION

PATENT NO.   : 6,023,192
DATED        : February 8, 2000
INVENTOR(S)  : Didier Belot It is certified that error appears in the above-identified patent and that said Letters Patent is hereby corrected as shown below:

{75} Inventor          Strike: "Belot Didier"
                       Insert: - - Didier Belot- -

Signed and Sealed this

Twenty-fourth Day of April, 2001

Attest:

NICHOLAS P. GODICI

Attesting Officer        *Acting Director of the United States Patent and Trademark Office*